US011862230B2

(12) United States Patent
Jia et al.

(10) Patent No.: US 11,862,230 B2
(45) Date of Patent: *Jan. 2, 2024

(54) NON-VOLATILE MEMORY DEVICE AND CONTROL METHOD

(71) Applicant: YANGTZE MEMORY TECHNOLOGIES CO., LTD., Wuhan (CN)

(72) Inventors: Jianquan Jia, Wuhan (CN); Ying Cui, Wuhan (CN); Kaikai You, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/965,527

(22) Filed: Oct. 13, 2022

(65) Prior Publication Data

US 2023/0030801 A1    Feb. 2, 2023

Related U.S. Application Data

(63) Continuation of application No. 17/353,727, filed on Jun. 21, 2021, now Pat. No. 11,501,822, which is a (Continued)

(51) Int. Cl.
*G11C 8/00* (2006.01)
*G11C 11/408* (2006.01)
(Continued)

(52) U.S. Cl.
CPC ...... *G11C 11/4085* (2013.01); *G11C 11/4074* (2013.01); *G11C 11/4094* (2013.01); *G11C 11/4099* (2013.01); *G11C 11/419* (2013.01)

(58) Field of Classification Search
CPC ........... G11C 11/4085; G11C 11/4074; G11C 11/4094; G11C 11/4099; G11C 11/419
(Continued)

(56) References Cited

U.S. PATENT DOCUMENTS 7,577,026 B2    8/2009  Dong et al.
9,142,313 B2 *  9/2015  Shim ...................... G11C 16/26
(Continued)

FOREIGN PATENT DOCUMENTS

CN    101627436 A    1/2010
CN    108389601 A    8/2018
(Continued)

*Primary Examiner* — Viet Q Nguyen
(74) *Attorney, Agent, or Firm* — BAYES PLLC

(57) ABSTRACT

A non-volatile memory device includes a plurality of word lines and a control circuit. The control circuit is configured to apply a first word line pre-pulse signal of a plurality of word line pre-pulse signals to a first group of the plurality of word lines, apply a second word line pre-pulse signal of the plurality of word line pre-pulse signals to a second group of the plurality of word lines during a pre-charge period, and apply a third word line pre-pulse signal of the plurality of word lines pre-pulse signals to a third group of the plurality of word lines during the pre-charge period. A voltage level of the second word line pre-pulse signal is greater than that of the first word line pre-pulse signal, and a voltage level of the third word line pre-pulse signal is greater than that of the second word line pre-pulse signal.

20 Claims, 4 Drawing Sheets

Related U.S. Application Data continuation of application No. 16/709,944, filed on Dec. 11, 2019, now Pat. No. 11,081,164, which is a continuation of application No. PCT/CN2019/112409, filed on Oct. 22, 2019.

(51) Int. Cl.
  *G11C 11/4074* (2006.01)
  *G11C 11/4094* (2006.01)
  *G11C 11/4099* (2006.01)
  *G11C 11/419* (2006.01)

(58) Field of Classification Search
  USPC .................................................. 365/230.06
  See application file for complete search history.

(56) References Cited

U.S. PATENT DOCUMENTS

| | | | |
|---|---|---|---|
| 9,349,471 B2 | 5/2016 | Yun | |
| 9,396,800 B2 | 7/2016 | Shim et al. | |
| 9,460,805 B1 | 10/2016 | Pang et al. | |
| 9,620,232 B2* | 4/2017 | Nam | G11C 16/34 |
| 9,837,164 B2* | 12/2017 | Yun | G11C 16/3431 |
| 10,153,029 B2* | 12/2018 | Kwak | G11C 8/12 |
| 10,157,674 B2* | 12/2018 | Kim | G11C 16/14 |
| 10,283,202 B1 | 5/2019 | Chen et al. | |
| 10,770,157 B1 | 9/2020 | Chen et al. | |
| 10,777,254 B2* | 9/2020 | Kwak | G11C 16/08 |
| 10,957,408 B1* | 3/2021 | Jia | G11C 16/0483 |
| 10,998,049 B1* | 5/2021 | Wei | G11C 16/10 |
| 11,017,838 B2* | 5/2021 | Kang | G11C 11/4085 |
| 11,024,371 B2* | 6/2021 | Cui | G11C 16/08 |
| 11,081,164 B2* | 8/2021 | Jia | G11C 11/419 |
| 11,205,471 B2* | 12/2021 | Choi | G11C 11/5642 |
| 11,501,822 B2* | 11/2022 | Jia | G11C 11/4074 |
| 2005/0018489 A1 | 1/2005 | Hosono | |
| 2008/0158991 A1 | 7/2008 | Hemink et al. | |
| 2011/0194351 A1 | 8/2011 | Kim et al. | |
| 2015/0221387 A1 | 8/2015 | Nam | |
| 2018/0053554 A1 | 2/2018 | Nam et al. | |
| 2018/0082731 A1 | 3/2018 | Lee | |
| 2018/0137925 A1 | 5/2018 | Nam et al. | |
| 2019/0108883 A1 | 4/2019 | Yu | |
| 2019/0147955 A1 | 5/2019 | Chen | |
| 2019/0156901 A1 | 5/2019 | Chen | |
| 2020/0006379 A1 | 1/2020 | Nishikawa et al. | |
| 2020/0353312 A1 | 11/2020 | Smith | |

FOREIGN PATENT DOCUMENTS

| | | |
|---|---|---|
| CN | 109935256 A | 6/2019 |
| CN | 110289034 A | 9/2019 |
| CN | 113053431 A | 6/2021 |
| JP | 2015176620 A | 10/2015 |
| KR | 20110032797 A | 3/2011 |

* cited by examiner

NON-VOLATILE MEMORY DEVICE AND CONTROL METHOD

CROSS REFERENCE TO RELATED APPLICATIONS

This application is a continuation of U.S. application Ser. No. 17/353,727, filed on Jun. 21, 2021, issued as U.S. Pat. No. 11,501,822, which is a continuation of U.S. application Ser. No. 16/709,944, filed on Dec. 11, 2019, issued as U.S. Pat. No. 11,081,164, which is a continuation of International Application No. PCT/CN2019/112409, filed on Oct. 22, 2019, all of which are incorporated herein by reference in their entireties.

BACKGROUND

The present disclosure is related to a non-volatile memory device and a control method, and more particularly to a non-volatile memory device and a control method capable of applying word line pre-pulse signals with different voltage levels and reducing programming disturb.

Non-volatile memory devices, such as flash memory, have become the storage of choice in various electrical products, such as personal computers, flash drives, digital cameras, and mobile phones. Flash memory devices have undergone rapid development. The flash memory can store data for a considerably long time without powering, and have advantages such as high integration level, fast access, easy erasing, and rewriting. To further improve the bit density and reduce cost of the flash memory device, a three-dimensional (3D) NAND flash memory has been developed. A 3D NAND memory architecture stacks memory cells vertically in multiple layers, achieving a higher density than traditional NAND memory. As more layers are added, the bit density increases, thus increasing more storage capacity. With the layer increases, the program disturb becomes worse. A pre-pulse signal may be applied to an unselected bit line connect to an unselected memory string so as to remove boosting charges (electrons) of the unselected memory string. However, as the layer increases, the channel length increases accordingly. The effect of bit line pre-charge for electrons remained in the bottom channel will be reduced because of the increased channel length. A traditional method for improving the bit line pre-charge effect is to extend the bit line pre-pulse time, but this would sacrifice and influence the data programming time. Another traditional method for improving the bit line pre-charge effect is to increase the voltage level of the bit line pre-pulse, but this would increase the risk of the breakdown phenomenon of the bit line transistor. Thus, there is a need for improvement.

SUMMARY

It is therefore an objective of the present disclosure to provide a non-volatile memory device and a control method capable of applying word line pre-pulse signals with different voltage levels and reducing programming disturb.

An embodiment provides a non-volatile memory device. The non-volatile memory device includes a memory array including a plurality of memory strings, each memory string including a select gate transistor and a plurality of memory cells connected in series with the select gate transistor; a bit line connected to a first memory string of the plurality of memory strings; a select gate line connected to the select gate transistor of the first memory string of the plurality of memory strings; a plurality of word lines connected to the plurality of memory cells of the first memory string of the plurality of memory strings, each word line connected to a respective memory cell of the first memory string; a first control circuit configured to apply a bit line pre-pulse signal to the bit line during a pre-charge period; and a second control circuit configured to apply a word line signal to a selected word line of the plurality of word lines and apply a plurality of word line pre-pulse signals to word lines disposed between the select gate line and the selected word line during the pre-charge period, wherein voltage levels of the plurality of word line pre-pulse signals are incremental.

Another embodiment provides a control method of non-volatile memory device. The non-volatile memory device includes a memory array including a plurality of memory strings and each memory string includes a select gate transistor and a plurality of memory cells connected in series with the select gate transistor. The control method includes applying a bit line pre-pulse signal to a bit line connected to a first memory string of the plurality of memory strings during a pre-charge period; applying a word line signal to a selected word line connected to a selected memory cell of the plurality of memory cells of the first memory string during the pre-charge period; and applying a plurality of word line pre-pulse signals to a plurality of word lines connected to the plurality of memory cells of the first memory string and disposed between the select gate line and the selected word line during the pre-charge period, wherein voltage levels of the plurality of word line pre-pulse signals are different.

These and other objectives of the present disclosure will no doubt become obvious to those of ordinary skill in the art after reading the following detailed description of the embodiments that is illustrated in the various figures and drawings.

DETAILED DESCRIPTION

Figure 1:
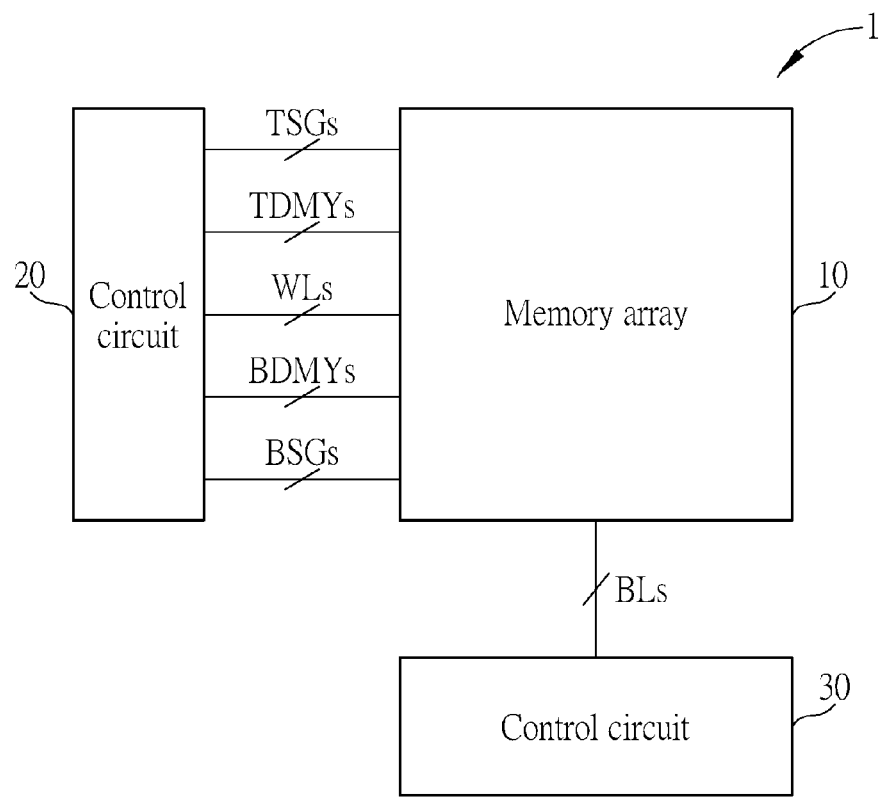
FIG. 1 is a schematic diagram of a non-volatile memory device according to an embodiment of the present disclosure.

Please refer to FIG. 1, which is a schematic diagram of a non-volatile memory device 1 according to an embodiment of the present disclosure. The non-volatile memory device 1 may be a NAND flash memory. For example, the non-volatile memory device 1 may be a three-dimensional (3D) NAND flash memory. The non-volatile memory device 1 includes a memory array 10 and control circuits 20 and 30. The memory array 10 includes a plurality of memory strings. Each memory string includes a plurality of memory cells. The memory cells of each string are connected together in series. The intersection of a word line and a semiconductor channel forms a memory cell. Top select gate lines TSGs, word lines WLs, top dummy word lines TDMYs, bottom dummy word lines BDMYs and bottom gate lines BSGs are connected between the memory array 10 and the control circuit 20. Bit lines BLs are connected between the memory array 10 and the control circuit 30.

Figure 2:
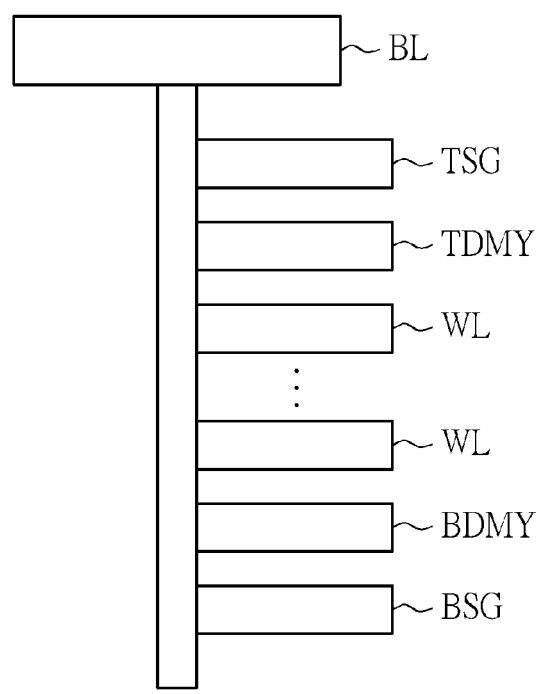
FIG. 2 is a schematic diagram illustrating a memory string and related connection lines of the non-volatile memory device shown in FIG. 1 according to an embodiment of the present disclosure.

FIG. 2 is a schematic diagram illustrating a memory string and related connection lines of the non-volatile memory device 1 shown in FIG. 1 according to an embodiment of the present disclosure. The memory string of the memory array 10 includes, but not limited thereto, a top select gate transistor, at least one top dummy memory cell, a plurality of memory cells, at least one bottom dummy memory cell and a bottom select gate transistor. A bit line BL is coupled to the memory string. A top select gate line TSG is connected to the top select gate transistor of the memory string. The at least one top dummy memory cell is connected in series with the top select gate transistor. At least one top dummy word line TDMY is connected to the at least one top dummy memory cell of the memory string. Each top dummy word line is separately connected to a top dummy memory cell. The plurality of memory cells can be configured to store data. The plurality of memory cells can be connected in series with the at least one top dummy memory cell. Word lines WL are connected to the memory cells of the memory string. Each word line WL is separately connected to a memory cell. Further, the memory cells of the memory string of the memory array 10 are disposed sequentially along a first direction between the top dummy memory cell and the bottom dummy memory cell and accordingly the word lines WL are disposed sequentially along the first direction between the top dummy word line TDMY and the bottom dummy word line BDMY.

Moreover, the at least one bottom dummy memory cell is connected in series with the plurality of memory cells. At least one bottom dummy word line BDMY is connected to the at least one bottom dummy memory cell of the memory string. Each bottom dummy word line BDMY is separately connected to a bottom dummy memory cell. The bottom select gate transistor is connected in series with the at least one bottom dummy memory cell. A bottom select gate line BSG is connected to the bottom select gate transistor of the memory string. Writing and erasing data in the memory cells can be controlled from the control circuits and external circuits trough the connection lines of the non-volatile memory device 1.

During a pre-charge period (before programming), the control circuit 30 is configured to apply a bit line pre-pulse signal to unselected bit lines BL of unselected memory strings of the memory array 10. For example, for each unselected memory string, the control circuit 30 is configured to apply a bit line pre-pulse signal to an unselected bit line BL of each unselected memory string during the pre-charge period. The control circuit 20 is configured to apply a top select gate pre-pulse signal to the top select gate line TSG and apply a bottom select gate pre-pulse signal to the bottom select gate line BSG. Moreover, the control circuit 20 is configured to apply a word line signal to a selected word line of the unselected memory string. The control circuit 20 is configured to apply a plurality of word line pre-pulse signals to word lines which are disposed between the selected word line and the top dummy word line TDMY (or the top select gate TSG). The control circuit 20 is also configured to apply a top dummy word line pre-pulse signal to the top dummy word lines TDMY disposed between the word lines and the top select gate TSG and apply a bottom dummy word line pre-pulse signal to the bottom dummy word lines BDMY disposed between the word lines and the bottom select gate BSG.

Moreover, voltage levels of the plurality of word line pre-pulse signals applied to the word lines disposed between the selected word line and the top dummy word line TDMY may be different. For example, the voltage levels of the plurality of word line pre-pulse signals applied to the word lines disposed between the selected word line and the top dummy word line TDMY may be incremental. For example, the voltage levels of the plurality of word line pre-pulse signals applied to the word lines disposed between the selected word line and the top dummy word line TDMY are incremental sequentially from a word line disposed adjacent to the selected word line. For example, a first word line pre-pulse signal of the plurality of word line pre-pulse signals can be applied to a first word line of the plurality of word lines, and the first word line is disposed adjacent to the selected word line and between the selected word line and the top dummy word line TDMY. A second word line pre-pulse signal of the plurality of word line pre-pulse signals can be applied to a second word line of the plurality of word lines, and the second word line is disposed adjacent to the first word line and between the first word line and the top dummy word line TDMY. In an embodiment, the voltage level of the second word line pre-pulse signal is greater than the voltage level of the first word line pre-pulse signal.

A third word line pre-pulse signal of the plurality of word line pre-pulse signals can be applied to a third word line of the plurality of word lines, and the third word line is disposed adjacent to the second word line and between the second word line and the top dummy word line TDMY. In an embodiment, the voltage level of the third word line pre-pulse signal is greater than the voltage level of the second word line pre-pulse signal. A fourth word line pre-pulse signal of the plurality of word line pre-pulse signals can be applied to a fourth word line, and the fourth word line is disposed adjacent to the third word line and between the third word line and the top dummy word line TDMY, and so on. In an embodiment, the voltage level of the fourth word line pre-pulse signal is greater than the voltage level of the third word line pre-pulse signal, and so on.

In other words, the farer away from the selected word line, the larger voltage level of the word line pre-pulse signal can be applied since the word line pre-pulse signals are applied to word lines disposed between the top select gate TSG and the selected word line. The voltage level of the word line pre-pulse signal applied to the word line located farthest from the selected word line may be the largest among the voltage levels of the plurality of word line pre-pulse signals applied to the word lines disposed between the selected word line and the top dummy word line TDMY. The voltage level of the word line pre-pulse signal applied to the word line located closet from the selected word line may be the smallest among the voltage levels of the plurality of word line pre-pulse signals applied to the word lines disposed between the selected word line and the top dummy word line TDMY. Since the word line pre-pulse signals with different voltage levels are applied to the word lines between the top select gate line and selected word line, the channel potential gradient is therefore enhanced, and thus enhancing the pre-charge effect of the unselected bit line and reducing programming disturb.

In addition, a voltage level of the top dummy word line pre-pulse signal applied to the top dummy word lines TDMY is greater than the voltage levels of the plurality of word line pre-pulse signals applied to the word lines disposed between the selected word line and the top dummy word line TDMY.

Figure 3:
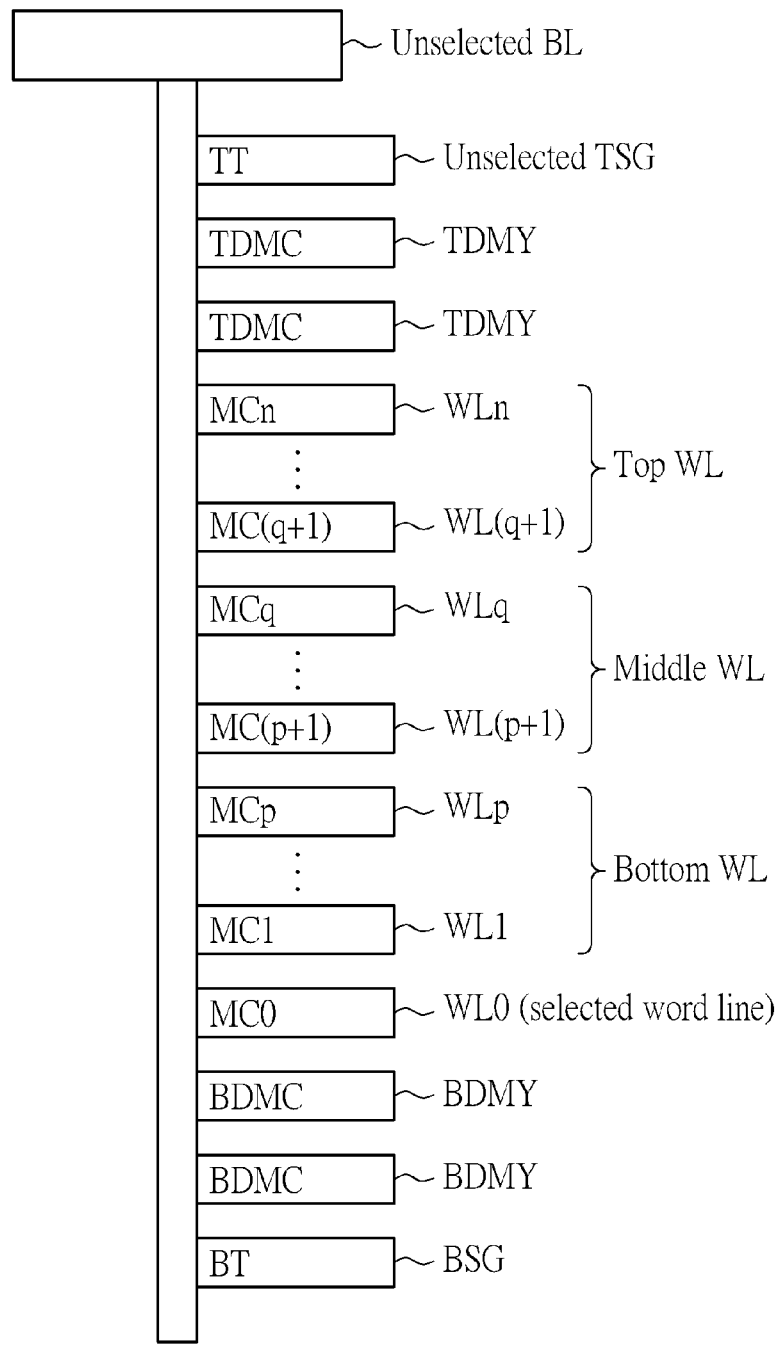
FIG. 3 is a schematic diagram illustrating an unselected memory string and related connection lines of the non-volatile memory device shown in FIG. 1 according to an embodiment of the present disclosure.

Moreover, the word lines disposed between the selected word line and the top select gate TSG can be divided into multiple groups of the word lines. Each divided group of word lines may include at least one word line. Note that, the amount of the word lines of each group of the word lines is not limited and may be varied and designed in accordance with practical system demands and requirements. Each group of the word lines may include at least one word line. For example, please refer to FIG. 3. FIG. 3 is a schematic diagram illustrating an unselected memory string and related connection lines of the non-volatile memory device 1 shown in FIG. 1 according to an embodiment of the present disclosure. A top select gate transistor TT, top dummy memory cells TDMY, memory cells MC0 to MCn, bottom dummy memory cells BDMC and a bottom select gate transistor BT are connected in series. FIG. 3 shows the unselected bit line BL, the top select gate line TSG, the top dummy word lines TDMY, the word lines WL0 to WLn, the bottom dummy word lines BDMY and the bottom select gate line BSG. As shown in FIG. 3, suppose the word line WL0 is the selected word line, the word lines WL1 to WLn are divided into a first group of word lines (Bottom WL), a second group of word lines (Middle WL) and a third group of word lines (Top WL). From the bottom to top, the first group of word lines (Bottom WL) includes the word lines WL1 to WLp. The first group of word lines (Bottom WL) is between the selected word line (word line WL0) and the second group of word lines (Middle WL). The second group of word lines (Middle WL) includes the word lines WL(p+1) to WLq. The second group of word lines (Middle WL) is between the first group of word lines (Bottom WL) and the third group of word lines (Top WL). The third group of word lines (Top WL) includes the word lines WL(q+1) to WLn. The third group of word lines (Top WL) is between the second group of word lines (Middle WL) and the top dummy word lines TDMY.

Figure 4:
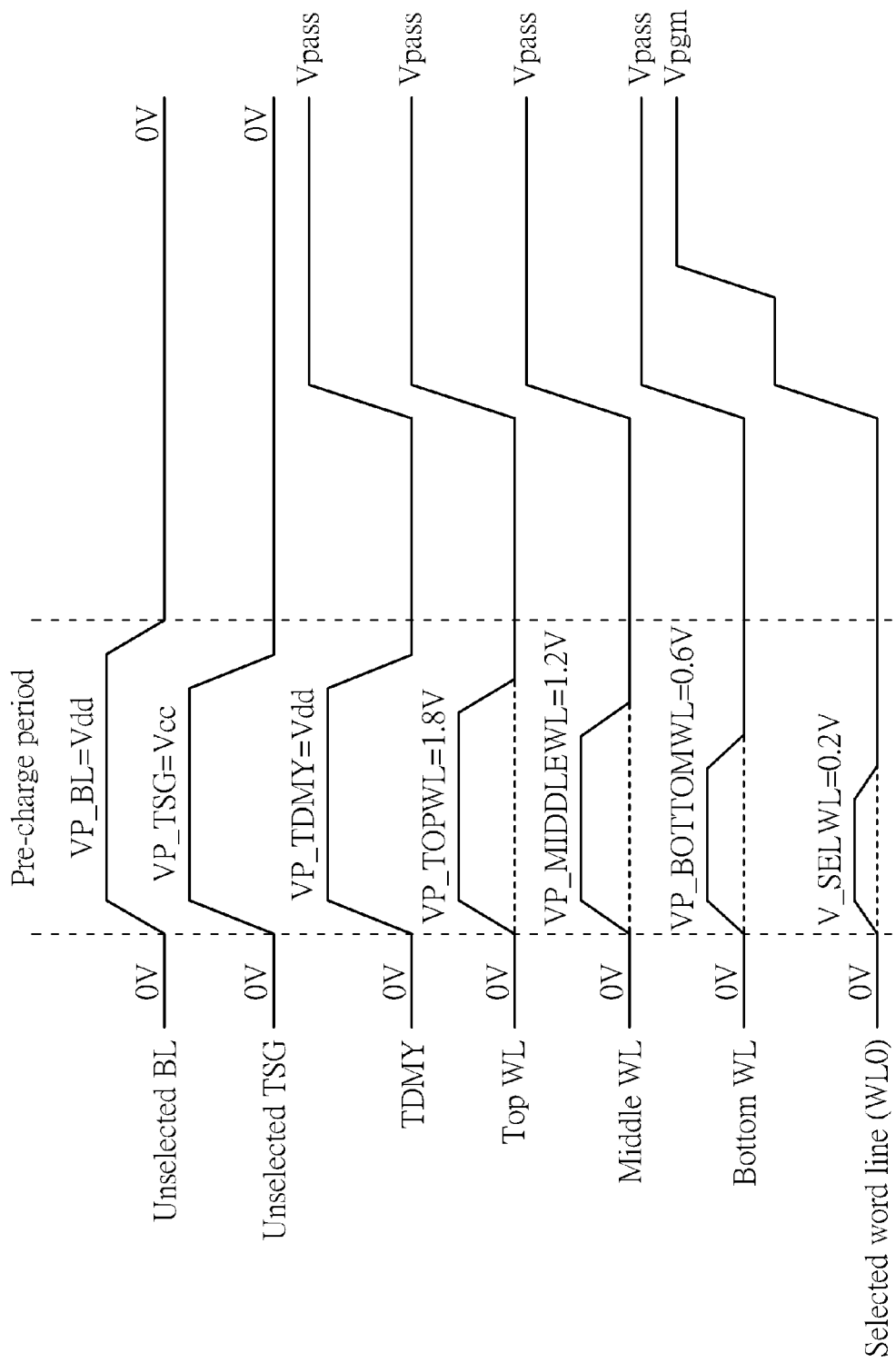
FIG. 4 and FIG. 5 are signal timing diagrams of the memory string shown in FIG. 3 according to embodiments of the present disclosure.

Please further refer to FIG. 3 and FIG. 4. FIG. 4 is a signal timing diagram of the memory string shown in FIG. 3 according to an embodiment of the present disclosure. Sequentially from the top of FIG. 4, the signal waveforms in a pre-charge period are: a bit line pre-pulse signal VP_BL, a top select gate pre-pulse signal VP_TSG, a top dummy word line pre-pulse signal VP_TDMY, word line pre-pulse signals VP_TOPWL, VP_MIDDLEWL and VP_BOTTOMWL and a word line signal V_SELWL. During a pre-charge period, the bit line pre-pulse signal VP_BL is applied to the unselected bit line BL of the unselected memory string of the memory array 10. The top select gate pre-pulse signal VP_TSG is applied to the top select gate line TSG. The top dummy word line pre-pulse signal VP_TDMY is applied to the top dummy word lines TDMY. The word line pre-pulse signals VP_TOPWL is applied to the third group of word lines (Top WL). The word line pre-pulse signals VP_MIDDLEWL is applied to the second group of word lines (Middle WL). The word line pre-pulse signals VP_BOTTOMWL is applied to the first group of word lines (Bottom WL). The bit line pre-pulse signal VP_BL applied to the unselected bit line BL may be a first power supply voltage Vdd. The top select gate pre-pulse signal VP_TSG applied to the top select gate line TSG may be a second power supply voltage Vcc. The top dummy word line pre-pulse signal VP_TDMY applied to the top dummy word lines TDMY may also be the first power supply voltage Vdd. The word line signal V_SELWL applied to the selected word line (WL0) can be a programming voltage.

Figure 5:
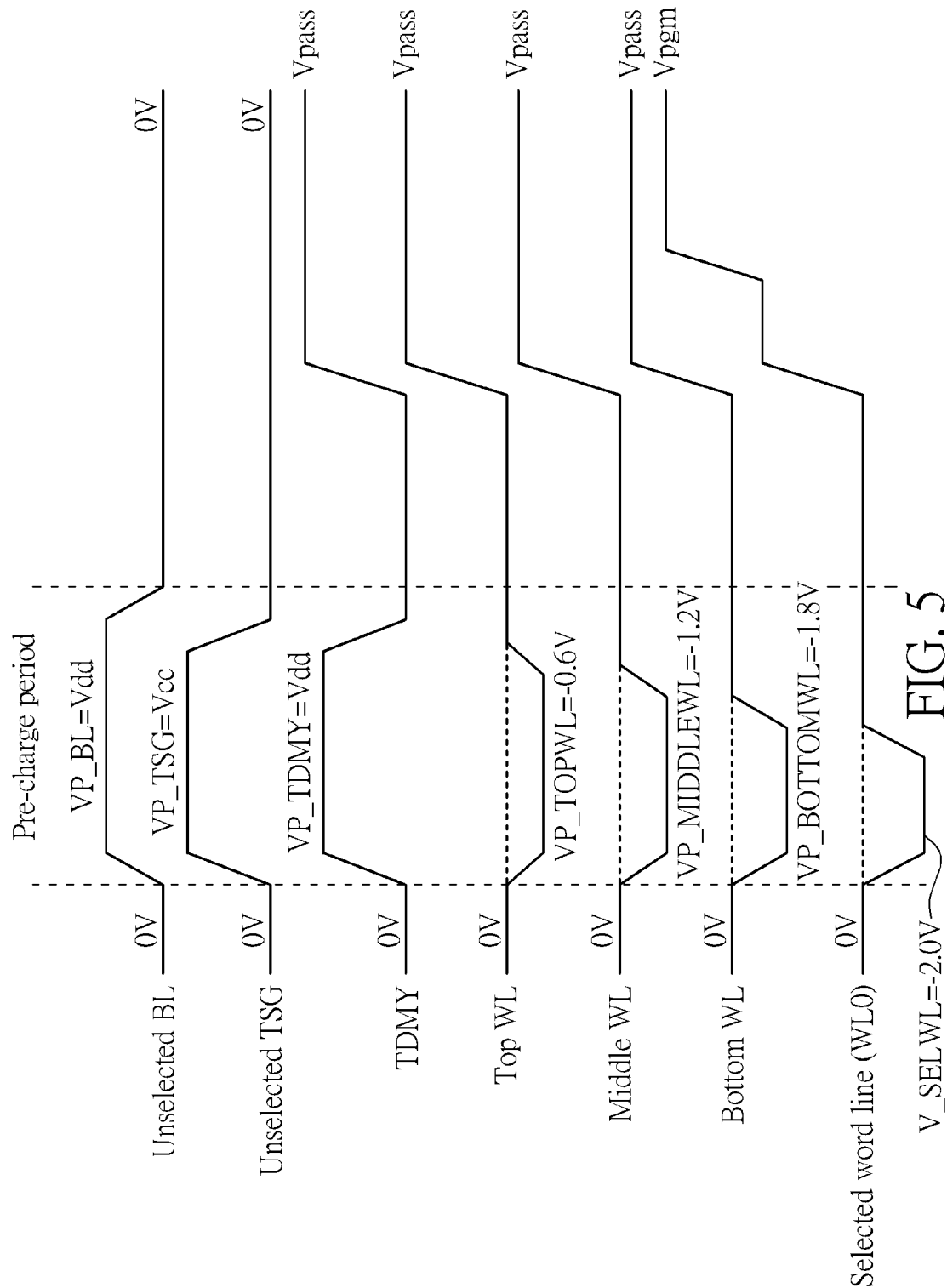

In an embodiment, as shown in FIG. 4, the voltage level (1.2 volts) of the word line pre-pulse signal VP_MIDDLEWL is greater than the voltage level (0.6 volts) of the word line pre-pulse signal VP_BOTTOMWL. The voltage level (1.8 volts) of the word line pre-pulse signal VP_TOPWL is greater than the voltage level (1.2 volts) of the word line pre-pulse signal VP_MIDDLEWL. The voltage level (Vdd) of top dummy word line pre-pulse signal VP_TDMY is greater than the voltage levels of the word line pre-pulse signals VP_TOPWL, VP_MIDDLEWL and VP_BOTTOMWL. In another embodiment, please further refer to FIG. 5. FIG. 5 is a signal timing diagram of the memory string shown in FIG. 3 according to an alternative embodiment of the present disclosure. Sequentially from the top of FIG. 5, the signal waveforms in a pre-charge period are: a bit line pre-pulse signal VP_BL, a top select gate pre-pulse signal VP_TSG, a top dummy word line pre-pulse signal VP_TDMY, word line pre-pulse signals VP_TOPWL, VP_MIDDLEWL and VP_BOTTOMWL and a word line signal V_SELWL. The word line pre-pulse signals VP_TOPWL, VP_MIDDLEWL and VP_BOTTOMWL and the word line signal V_SELWL are negative pulse signals. As shown in FIG. 5, the voltage level (−1.2 volts) of the word line pre-pulse signal VP_MIDDLEWL is greater than the voltage level (−1.8 volts) of the word line pre-pulse signal VP_BOTTOMWL. The voltage level (−0.6 volts) of the word line pre-pulse signal VP_TOPWL is greater than the voltage level (−1.2 volts) of the word line pre-pulse signal VP_MIDDLEWL. The voltage level (Vdd) of top dummy word line pre-pulse signal VP_TDMY is greater than the voltage levels of the word line pre-pulse signals VP_TOPWL, VP_MIDDLEWL and VP_BOTTOMWL.

In an embodiment, please further refer to FIGS. 3-5. During the pre-charge period, the ending of the word line pre-pulse signal VP_MIDDLEWL applied to the second group of word lines (Middle WL) occurs after the ending of the word line pre-pulse signal VP_BOTTOMWL applied to the first group of word lines (Bottom WL). The ending of the word line pre-pulse signal VP_TOPWL applied to the third group of word lines (Top WL) occurs after the ending of the word line pre-pulse signal VP_MIDDLEWL applied to the second group of word lines (Middle WL). The ending of the top dummy word line pre-pulse signal VP_TDMY applied to the top dummy word lines TDMY occurs after the endings of the word line pre-pulse signals VP_TOPWL, VP_MIDDLEWL and VP_BOTTOMWL. As shown in FIG. 4 and FIG. 5, the end point of the word line pre-pulse signal VP_MIDDLEWL applied to the second group of word lines (Middle WL) is after the end point of the word line pre-pulse signal VP_BOTTOMWL applied to the first group of word lines (Bottom WL) during the pre-charge period. The end point of the word line pre-pulse signal VP_TOPWL applied to the third group of word lines (Top WL) is after the end point of the word line pre-pulse signal VP_MIDDLEWL applied to the second group of word lines (Middle WL) during the pre-charge period. The end point of the top dummy word line pre-pulse signal VP_TDMY applied to the top dummy word lines TDMY is after the end points of the word line pre-pulse signals VP_TOPWL, VP_MIDDLEWL and VP_BOTTOMWL. Since the word line pre-pulse signals with different ending timing are applied to the word lines between the top select gate line and selected word line, the whole programming speed can be improved effectively.

Moreover, as shown in FIG. 4, since the word line pre-pulse signals VP_TOPWL, VP_MIDDLEWL and VP_BOTTOMWL are positive pulse signals, the falling edge of the word line pre-pulse signal VP_MIDDLEWL is after the falling edge of the word line pre-pulse signal VP_BOTTOMWL during the pre-charge period. The falling edge of the word line pre-pulse signal VP_TOPWL is after the falling edge of the word line pre-pulse signal VP_MIDDLEWL during the pre-charge period. The falling edge of the top dummy word line pre-pulse signal VP_TDMY applied to the top dummy word lines TDMY is after the falling edges of the word line pre-pulse signals VP_TOPWL, VP_MIDDLEWL and VP_BOTTOMWL. As shown in FIG. 5, since the word line pre-pulse signals VP_TOPWL, VP_MIDDLEWL and VP_BOTTOMWL are negative pulse signals, the rising edge of the word line pre-pulse signal VP_MIDDLEWL is after the rising edge of the word line pre-pulse signal VP_BOTTOMWL during the pre-charge period. The rising edge of the word line pre-pulse signal VP_TOPWL is after the rising edge of the word line pre-pulse signal VP_MIDDLEWL during the pre-charge period. The rising edge of the top dummy word line pre-pulse signal VP_TDMY is after the rising edges of the word line pre-pulse signals VP_TOPWL, VP_MIDDLEWL and VP_BOTTOMWL.

In an embodiment, please further refer to FIGS. 4-5. During the pre-charge period, the pulse durations (signal lengths) of the word line pre-pulse signals VP_TOPWL, VP_MIDDLEWL and VP_BOTTOMWL are incremental. The pulse duration of the word line pre-pulse signal VP_MIDDLEWL applied to the second group of word lines (Middle WL) is greater than the pulse duration of the word line pre-pulse signal VP_BOTTOMWL applied to the first group of word lines (Bottom WL). The pulse duration of the word line pre-pulse signal VP_TOPWL applied to the third group of word lines (Top WL) is greater than the ending of the word line pre-pulse signal VP_MIDDLEWL applied to the second group of word lines (Middle WL). The pulse duration of the top dummy word line pre-pulse signal VP_TDMY applied to the top dummy word lines TDMY is greater than the pulse durations of the word line pre-pulse signals VP_TOPWL, VP_MIDDLEWL and VP_BOTTOMWL.

In summary, the embodiments of the present disclosure provide word line pre-pulse signals with different to drive the word lines between the top select gate line and selected word line so as to enhance channel potential gradient, and thus enhancing the pre-charge effect of the unselected bit line and reducing programming disturb. Moreover, the embodiments of the present disclosure provide word line pre-pulse signals with different ending timing to the word lines between the top select gate line and selected word line, and thus improving the whole programming speed effectively.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A non-volatile memory device, comprising:
a plurality of word lines; and
a control circuit configured to:
apply a first word line pre-pulse signal of a plurality of word line pre-pulse signals to a first group of the plurality of word lines,
apply a second word line pre-pulse signal of the plurality of word line pre-pulse signals to a second group of the plurality of word lines during a pre-charge period, and
apply a third word line pre-pulse signal of the plurality of word lines pre-pulse signals to a third group of the plurality of word lines during the pre-charge period,
wherein a voltage level of the second word line pre-pulse signal is greater than that of the first word line pre-pulse signal, and a voltage level of the third word line pre-pulse signal is greater than that of the second word line pre-pulse signal.

2. The non-volatile memory device of claim 1, wherein the control circuit is further configured to:
apply a select pre-pulse signal of the plurality of word line pre-pulse signals to a selected word line of the plurality of word lines during the pre-charge period, wherein the select pre-pulse signal is different from the second word line pre-pulse signal.

3. The non-volatile memory device of claim 2, wherein the first group of the plurality of word lines, the second group of the plurality of word lines, and the third group of the plurality of word lines are at a same side of the selected word line.

4. The non-volatile memory device of claim 2, wherein the first group of the plurality of word lines, the second group of the plurality of word lines, and the third group of the plurality of word lines are disposed in an order of distance from the selected word line.

5. The non-volatile memory device of claim 2, wherein the first group of the plurality of word lines are disposed adjacent to the selected word line, the second group of the plurality of word lines are disposed between the first group of the plurality of word lines and a top select gate line, and the third group of the plurality of word lines are disposed between the second group of the plurality of word lines and the top select gate line, wherein the selected word line are between the top select gate line and a bottom select gate line.

6. The non-volatile memory device of claim 1, wherein voltages of at least two groups of the plurality of word lines change during a first period of the pre-charge period, wherein the first period of the pre-charge period is adjacent to a programming period in which a voltage Vpass is applied to the plurality of word lines.

7. The non-volatile memory device of claim 1, wherein voltages of at least two groups of the plurality of word lines are zero volts during a period after the pre-charge period and before a voltage Vpass being applied to word lines disposed between a selected word line and a top select gate line.

8. The non-volatile memory device of claim 1, wherein voltages of at least two groups of the plurality of word lines decrease during a period after the pre-charge period and before a voltage Vpass being applied to word lines disposed between a selected word line and a top select gate line.

9. The non-volatile memory device of claim 1, wherein voltage levels of the plurality of word line pre-pulse signals are positive, negative, or zero volts.

10. The non-volatile memory device of claim 5, wherein the control circuit is configured to apply a bit line pre-pulse signal to a bit line during the pre-charge period.

11. The non-volatile memory device of claim 10, further comprising: a first memory string connected to the top select gate line and being an unselected memory string, and the bit line is an unselected bit line.

12. The non-volatile memory device of claim 2, wherein the control circuit is configured to apply a top dummy word line pre-pulse signal to a top dummy word line of the plurality of word lines during the pre-charge period, wherein the selected word line is between the top dummy word line and a bottom select gate line.

13. The non-volatile memory device of claim 12, wherein a voltage level of the top dummy word line pre-pulse signal is greater than that of the third word line pre-pulse signal.

14. The non-volatile memory device of claim 1, wherein a charge duration of the second word line pre-pulse signal is greater than that of the first word line pre-pulse signal, and a charge duration of the third word line pre-pulse signal is greater than that of the second word line pre-pulse signal.

15. The non-volatile memory device of claim 1, wherein voltage levels of the first word line pre-pulse signal, the second word line pre-pulse signal, and the third word line pre-pulse signal are negative, wherein an absolute value of a voltage level of the first word line pre-pulse signal is greater than that of the second word line pre-pulse signal, and an absolute value of a voltage level of the second word line pre-pulse signal is greater than that of the third word line pre-pulse signal.

16. A control method of non-volatile memory device, wherein the non-volatile memory device comprises a plurality of word lines, the control method comprises:
   applying a first word line pre-pulse signal of a plurality of word line pre-pulse signals to a first group of the plurality of word lines;
   applying a second word line pre-pulse signal of the plurality of word line pre-pulse signals to a second group of the plurality of word lines during a pre-charge period; and
   applying a third word line pre-pulse signal of the plurality of word lines pre-pulse signals to a third group of the plurality of word lines during the pre-charge period,
   wherein a voltage level of the second word line pre-pulse signal is greater than that of the first word line pre-pulse signal, and a voltage level of the third word line pre-pulse signal is greater than that of the second word line pre-pulse signal.

17. The control method of claim 16, further comprising:
   applying a select pre-pulse signal of the plurality of word line pre-pulse signals to a selected word line of the plurality of word lines during the pre-charge period, wherein the select pre-pulse signal is different from the second word line pre-pulse signal.

18. The control method of claim 17, wherein the first group of the plurality of word lines, the second group of the plurality of word lines, and the third group of the plurality of word lines are at a same side of the selected word line and are disposed in an order of distance from the selected word line.

19. The control method of claim 16, wherein voltages of at least two groups of the plurality of word lines change during a first period of the pre-charge period, wherein the first period of the pre-charge period is adjacent to a programming period in which a voltage Vpass is applied to the plurality of word lines.

20. The control method of claim 16, wherein voltages of at least two groups of the plurality of word lines are zero volts during a period after the pre-charge period and before a voltage Vpass being applied to word lines disposed between a selected word line and a top select gate line, or voltages of the at least two groups of the plurality of word lines decrease during the period after the pre-charge period and before the voltage Vpass being applied to the word lines disposed between the selected word line and the top select gate line.

* * * * *